United States Patent [19]

Hayashi et al.

[11] Patent Number: 5,150,390
[45] Date of Patent: Sep. 22, 1992

[54] HIGH-RATE PULSE PATTERN GENERATOR

[75] Inventors: Mishio Hayashi, Menuma; Tetsuo Sotome, Tatebayashi, both of Japan

[73] Assignee: Advantest Corporation, Tokyo, Japan

[21] Appl. No.: 748,755

[22] Filed: Aug. 20, 1991

[30] Foreign Application Priority Data

Aug. 20, 1990 [JP] Japan .................. 2-218454

[51] Int. Cl.$^5$ ............................................ H03K 5/13
[52] U.S. Cl. ................................ 377/116; 377/56; 377/114; 328/72; 328/133
[58] Field of Search ............ 377/33, 41, 56, 116, 377/114; 328/72, 73, 74, 133

[56] References Cited

U.S. PATENT DOCUMENTS

| | | | |
|---|---|---|---|
| 4,719,365 | 1/1988 | Misono | 328/133 |
| 4,757,264 | 7/1988 | Lee et al. | 328/72 |
| 4,868,430 | 9/1989 | Stewart | 328/72 |
| 5,060,243 | 10/1991 | Eckert | 377/116 |
| 5,062,126 | 10/1991 | Radys | 377/116 |

*Primary Examiner*—John S. Heyman
*Attorney, Agent, or Firm*—Staas & Halsey

[57] ABSTRACT

Frequency division circuits in n stages sequentially ½-frequency-divide an input clock signal. Pattern generating circuit generates and issues a plurality of pattern data parallel to each other in synchronism with a frequency-divided clock from the final frequency division stage thereof. Multiplexing circuits in n stages are given a plurality of pattern data and multiplex input pattern data in each stage for each two data. Output clock signals of the n-th through first stage frequency division circuits are supplied to the first through n-th multiplexing circuits via respective delay circuits as multiplexing control clock signals. A retiming circuit is inserted in series to the input of at least one of the multiplexing circuits, and a multiplexing control clock signal applied to said one multiplexing circuit from the corresponding frequency division circuit is given to the retiming circuit as a retiming clock signal. A phase switching circuit is inserted in series to the output of the frequency division circuit which applies the multiplexing control clock signal to said one multiplexing circuit. When a node of the input pattern data in the retiming circuit approaches the edge of a retiming clock signal within a predetermined range, an approach detection signal is issued from the approach detection circuit. The phase switching circuit shifts the phase of the input clock signal in response to the approach detection signal by a predetermined quantity and issues the phase-shifted clock signal.

12 Claims, 12 Drawing Sheets

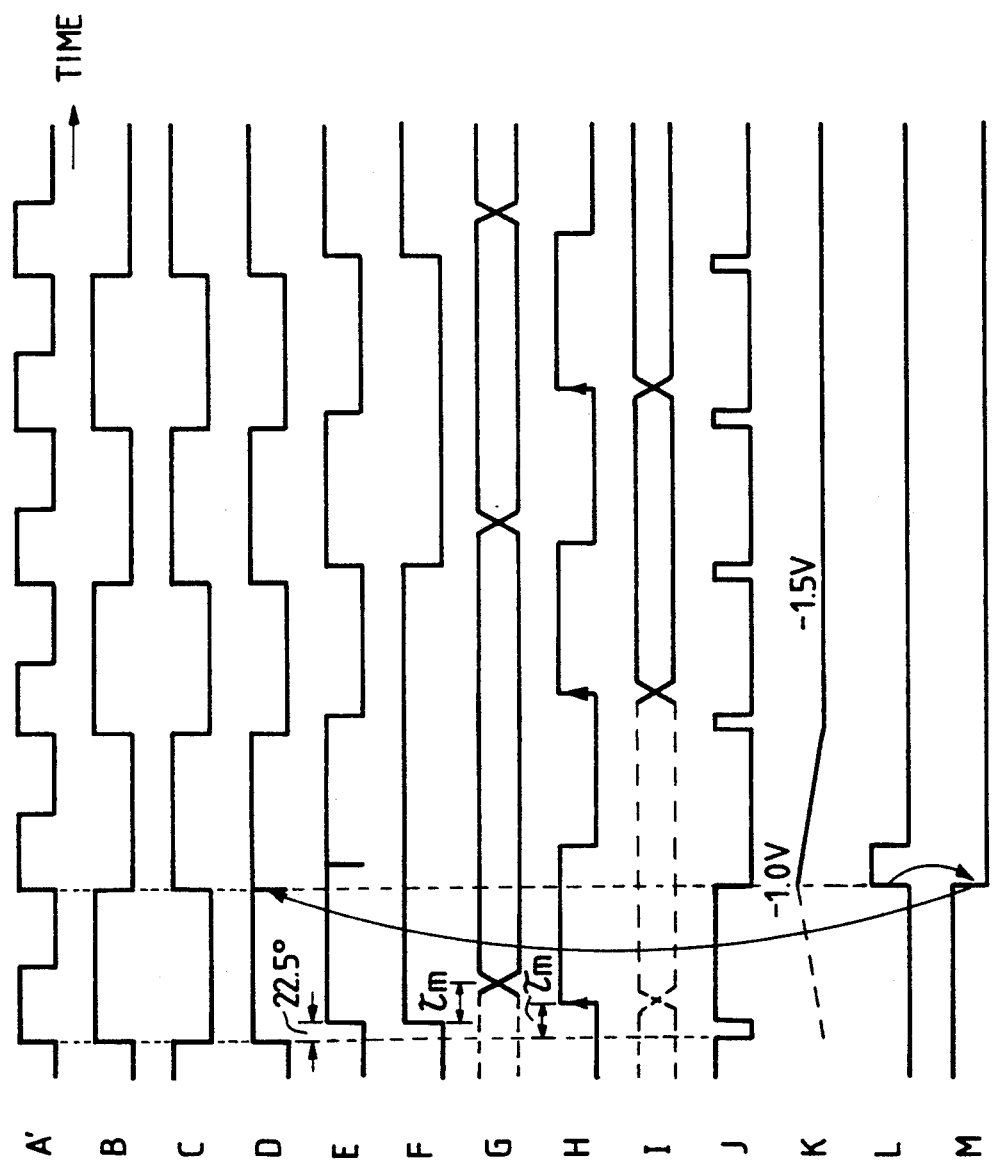

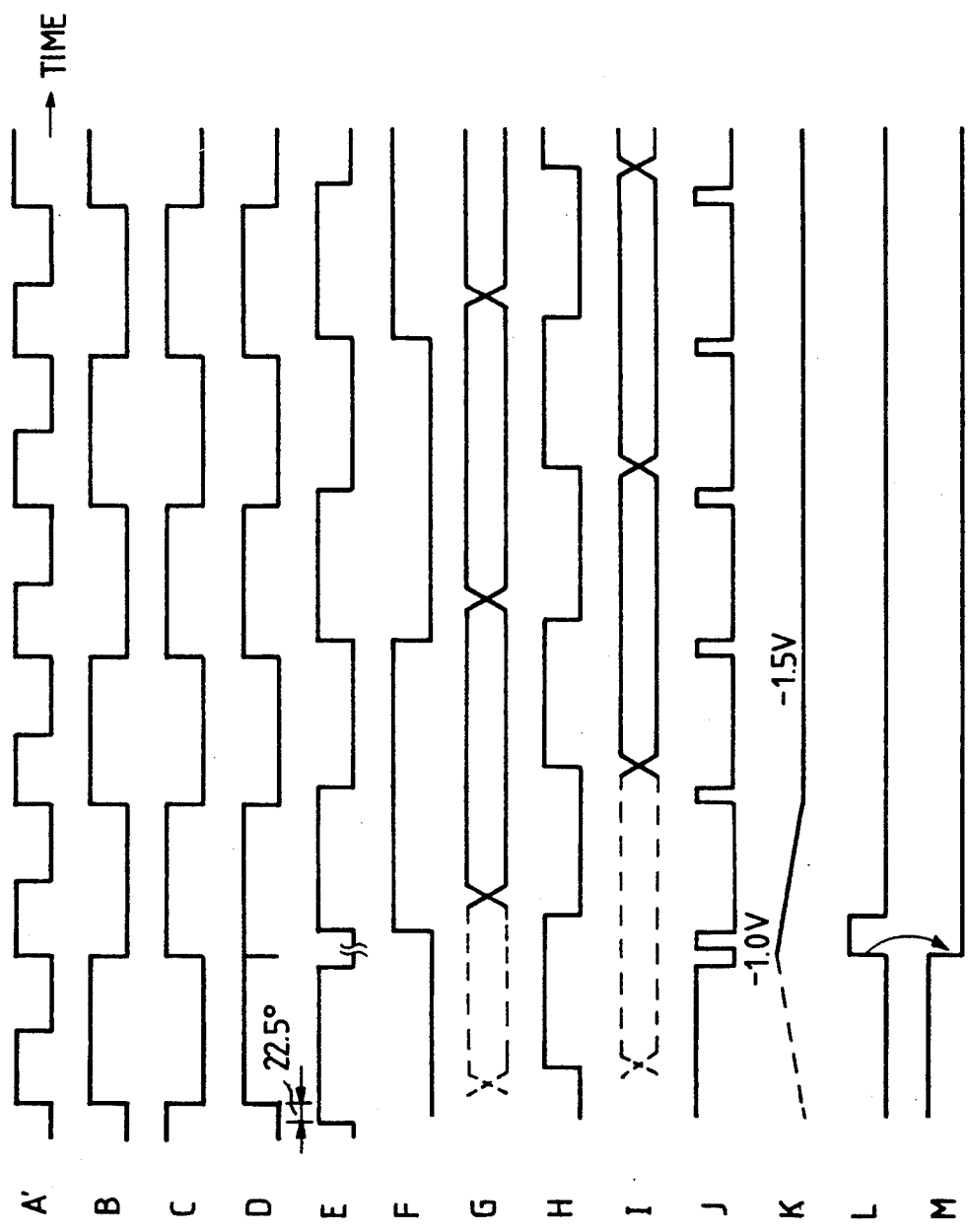

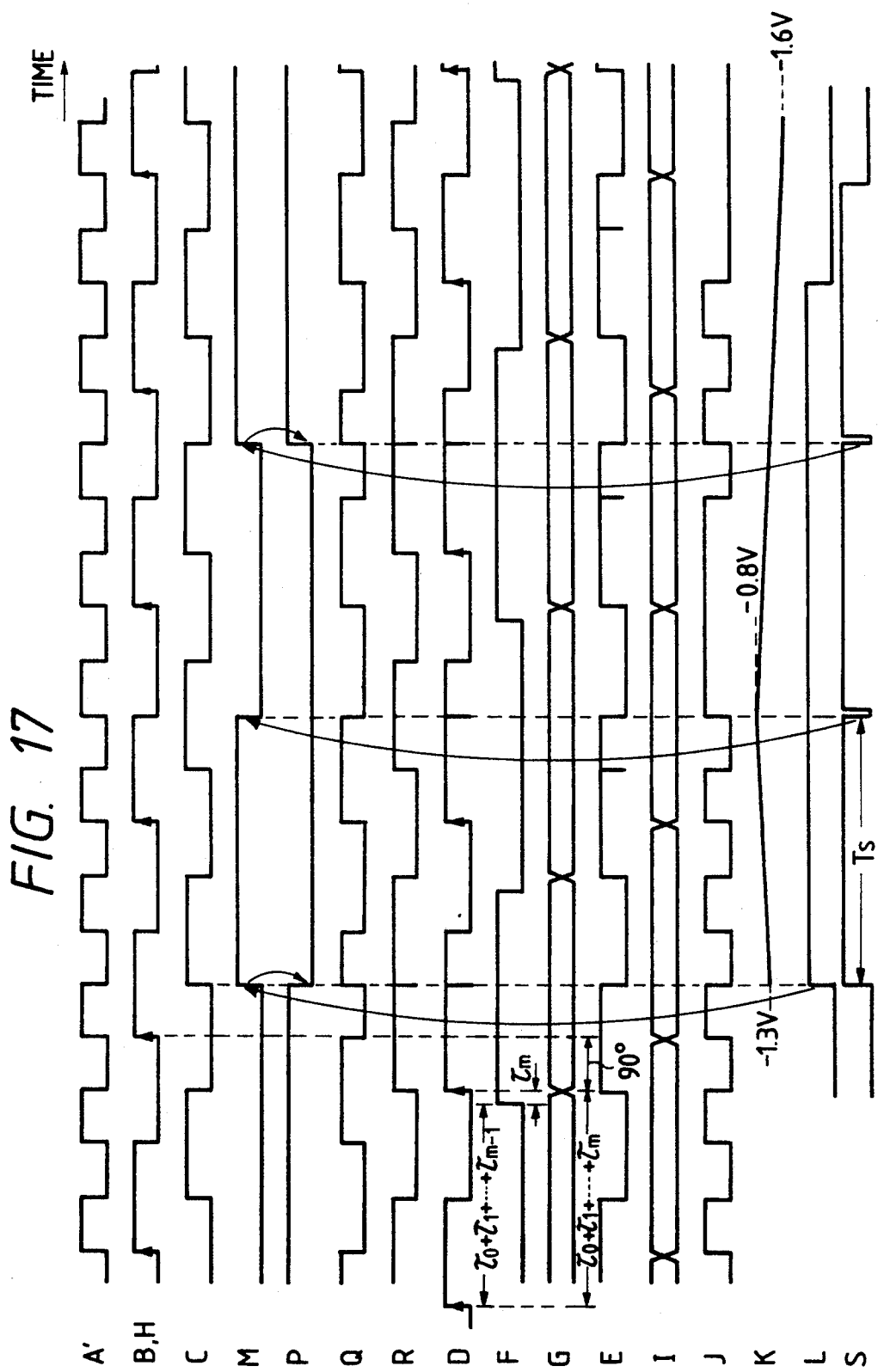

| P / M | 0 | 1 |
|---|---|---|
| 0 | 90° | 270° |
| 1 | 0° | 180° |

HIGH-RATE PULSE PATTERN GENERATOR

BACKGROUND OF THE INVENTION

The present invention relates to a high-rate pulse pattern generator that, for instance, generates a pulse pattern and supplies it to an object circuit, detects an error of an output pulse pattern issued from said object circuit and measures an error rate and more particularly, to such a high-rate pulse pattern generator that parallel patterns generated from pattern generating circuits are sequentially multiplexed in multiple stages by a plurality of multiplexing circuits and issued as a high-rate pattern.

FIG. 1 shows a conventional high-rate pulse pattern generator known in the prior art. An input clock signal CK enters from an input terminal 11 into a frequency division circuit $12_1$ in a first stage of cascade-connected n units of ½ frequency division circuits $12_1$-$12_n$, and an output clock from the frequency division circuit $12_n$ in the last stage enters a pattern generating circuit 13. Every time a clock enters into the pattern generating circuit 13, it issues data of $2^n$ patterns parallel to each other, and said $2^n$ parallel pattern data enter a multiplexing circuit $14_1$ in the first stage of n multiplexing circuits $14_1$-$14_n$ connected in cascade. In each multiplexing circuit, input patterns are multiplexed every two patterns into a pattern and then issued as an output. Consequently, the number of parallel patterns becomes one half at each multiplexing circuit. Each output of the ½ frequency division circuit $12_n$, $12_{n-1}$,—or $12_1$ is delayed respectively in a delay circuit $15_1$, $15_2$,—or $15_n$ while the multiplexing circuits $14_1$-$14_n$ are controlled for multiplexing by each output of the delay circuits $15_1$-$15_n$, respectively. The output pattern from the multiplexing circuit $14_n$ in the final stage is supplied to a data terminal D of a retiming circuit 16 where said output pattern is subject to retiming by the input clock signal to the input terminal 11 delayed by the delay circuit $15_r$, and then output onto an output terminal 17.

The pattern generating circuit 13 is for instance shown in FIG. 2 where clock pulses enter from a terminal 18 and counted by a K-bit binary counter 19. Using each count value of said binary counter 19 as an address, a memory (RAM or ROM) 21 of a capacity of $2^k \times 2^n$ bits is read out and then $2^n$ pieces of parallel data (patterns) D1, D2, —, D$2^n$ are output. At that time, a delay time $\tau_0$ exists from a rising edge of a clock at the terminal 18 to a conversion point (a node, namely a pattern data starting point for said clock) for a data of an output pattern generated in response to said edge. A PRBS (pseudo random binary sequence) generator, etc. may also be used in place of the memory 21.

The multiplexing circuit $14_1$ is shown in FIG. 3 for instance where odd-numbered parallel input patterns (Nos. 1, 3, —, $2^n$−1) among $2^n$ parallel input patterns are supplied to gates G1, G3, —, G$2^n$−1, while supplying even-numbered ones (Nos. 2, 4, —, $2^n$) to gates G2, G4, —, G$2^n$. A clock signal of a duty of 50% is supplied from the terminal 23 directly into gates G1, G3, —, G$2^n$−1 while said clock signal is inverted and supplied to gates G2, G4, —, G$2^n$. Each gate G1, G3, —, G$2^n$−1 to which the clock signal is directly supplied is paired respectively with other each gate G2, G4, —, G$2^n$, and both outputs of each pair are supplied to each OR circuit R1, R2, —, R$2^{n-1}$, respectively. Consequently, each OR circuit R1, R2, —, R$2^{n-1}$ issues an odd-numbered input pattern data in the first half cycle of each clock, while in the latter half cycle even-numbered input pattern data being output. As a result, the input data is multiplexed into $2^{n-1}$ pieces of parallel pattern data. In this case, a delay time $\tau_1$ exists from a rising edge of the clock at terminal 23 to each node of the output pattern data generated in response to said edge. The other multiplexing circuits $14_2$-$14_n$ are composed also in the same principles, in which there are delay times $\tau_2$-$\tau_n$, respectively. The operating frequency of each multiplexing circuit $14_1$-$14_n$ becomes higher as the circuit is closer to the output terminal 17. Therefore, response of a multiplexing circuit is required to be higher where the circuit is closer to the output terminal 17, in normal cases. Consequently, a relationship $$\tau_0 > \tau_1 > \tau_2 > - > \tau_n - \tag{1}$$

holds valid.

To create these delay times, the clock signals are delayed in the delay circuits $15_1$, $15_2$, —, $15_n$ by delay times $\tau_1$, $\tau_0 + \tau_1$, —, $\tau_0 + \tau_1 + - + \tau_{n-1}$, respectively, which are supplied to the multiplexing circuit $14_1$, $14_2$, —, $14_n$ as multiplexing control clock signals. In addition, the clock signal is delayed in the delay circuit $15_r$ by $\tau_0 + \tau_1 + - + \tau_n + T_0$ and supplied to the retiming circuit 16.

Assuming that n=3 and the input clock signal at the terminal 11 in FIG. 1 is as shown in Row A of FIG. 4, the outputs of the frequency division circuits $12_1$, $12_2$ and $12_3$ become as shown in Rows B, C and D since the input clock signal CK is sequentially frequency divided by 2. In response to the clock pulse in Row D of FIG. 4, the output pattern of the pattern generating circuit 13 is delayed by $\tau_0$ as shown in Row E of FIG. 4. Accordingly, the delay circuit $15_1$ is selected to have a delay $\tau_0$, of which the output becomes as shown in Row F of FIG. 4. Since the output of the multiplexing circuit $14_1$ is delayed by $\tau_1$ from the input as shown in Row G of FIG. 4, a delay of $\tau_0 + \tau_1$ is effected by the delay circuit $15_2$ as shown in Row H of FIG. 4. In the same way, the outputs of the multiplexing circuit $14_2$, delay circuit $15_3$, multiplexing circuit $14_3$, delay circuit $15_r$ and the output terminal 17 become as shown in Rows I, J, K, L and M, respectively of FIG. 4. In FIGS. 1 and 4, each delay time of the ½ frequency division circuits $12_1$-$12_3$ and the retiming circuit 16 is assumed to be zero. However, a delay occurs actually in them. But, it is enough to consider the delays of the frequency dividers $12_1$ through $12_n$ as included in the delays $\tau_1$ through $\tau_n$ of the multiplexing circuits $14_1$ through $14_n$, respectively. The time $T_0$ is selected normally to be a half of the data cycle of an output pattern when the input clock signal of the terminal 11 is made highest.

With the conventional pattern generator shown in FIG. 1, it is required to delay each output clock signal of the frequency division circuits $12_1$-$12_n$ longer as the frequency is higher, and to supply the delayed clock signal to the related multiplexing circuit. The higher the frequency of the output pattern to be attempted, the more the number of the multiplexing circuits required. Correspondingly, the delay time of the delay circuit $15_r$ becomes longer.

For instance, if it is attempted to obtain the output pattern of 10 GHz, $\tau_0 + - + \tau_n$ reaches at least 40 ns. The delay circuit currently available to delay the clock signal of 10 GHz is only a coaxial cable whose delay time is 5 ns/m, so a cable length of 8 m is required for the delay of 40 ns. When a clock signal of a frequency as high as 10 GHz is to be applied into a coaxial cable, it is inevitable to insert amplifiers 26 at 2 m intervals along the coaxial cable 25. That is, in order to have the output pattern of 10 GHz, four 2 m pieces of coaxial cables and four amplifiers such as shown in FIG. 5 are required as the delay circuit $15_r$. Furthermore, since the signal is band restricted by the amplifiers 26, the waveform of the delayed output clock signal deteriorates so much as no correct retiming could be effected. In addition, the price also becomes higher.

SUMMARY OF THE INVENTION

An object of the present invention is to provide a high-rate pulse pattern generator in which the setting of multiplexing control timings can be effected using rather short delay circuits.

According to the present invention, an intermediate retiming circuit is inserted at least at an intermediate position of multiplexing circuits connected in multiple stages, and the output of the multiplexing circuit immediately before the intermediate retiming circuit is subjected to retiming by the output clock of the frequency division circuit corresponding to the multiplexing circuit immediately after the intermediate retiming circuit. At that time, it is attempted that the clock supplied from said frequency division circuit to the intermediate retiming circuit is not substantially delayed. Thanks to retiming by the said intermediate retiming circuit, clocks supplied to the multiplexing circuits in the stages thereafter may satisfactorily be delayed according to delay times created in the stages after the intermediate retiming circuit. If the retiming clock in the intermediate retiming circuit becomes close in excess to the node of the input pattern data, no correct retiming is effected. Consequently, when said retiming clock and the pattern data node become too close to each other, it is detected by a detection means. By such a detection output, the phase of a clock signal to be supplied to the frequency division circuit that generates a clock signal for multiplexing control to the multiplexing circuit immediately before the intermediate retiming circuit is controlled.

BRIEF DESCRIPTION OF THE DRAWINGS

FIG. 10 is a time chart showing an example of the waveform in each part when a retiming clock of the intermediate retiming circuit approaches the node of the input pattern data in a leading phase;

FIG. 11 is a time chart showing an example of the waveform in each part when a retiming clock of the intermediate retiming circuit approaches the node of the input pattern data in lagging phase;

FIG. 17 is a time chart describing the operation of the embodiment of FIG. 15.

DETAILED DESCRIPTION OF THE PREFERRED EMBODIMENTS

Figure 1:
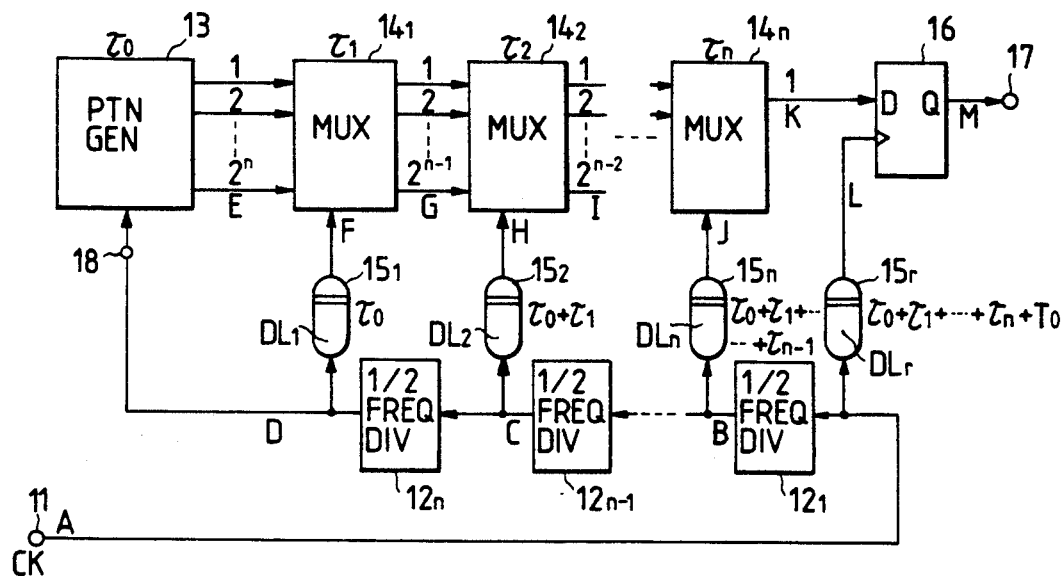
FIG. 1 is a block diagram showing a conventional pattern generator.
Figure 2:
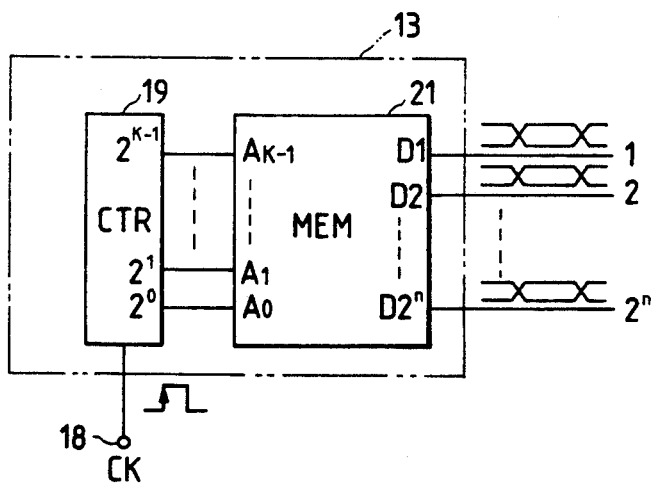
FIG. 2 is a block diagram showing an example of a conventional pattern generating circuit 13.
Figure 3:
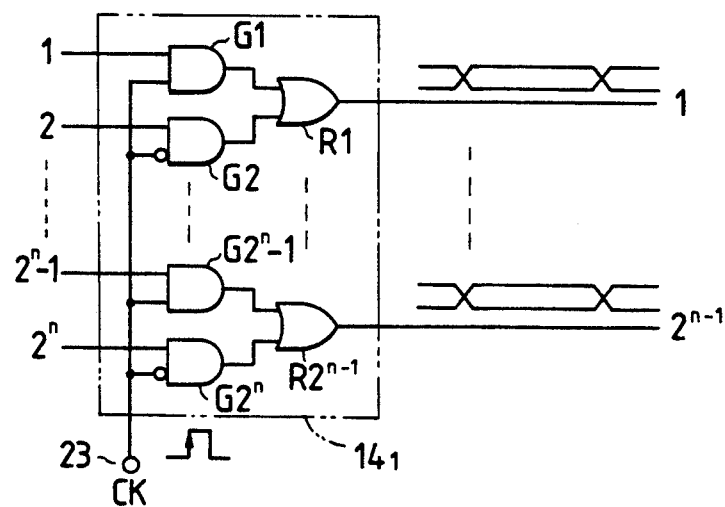
FIG. 3 is a logical circuit diagram showing an embodiment of the multiplexing circuit $14_1$.
Figure 5:
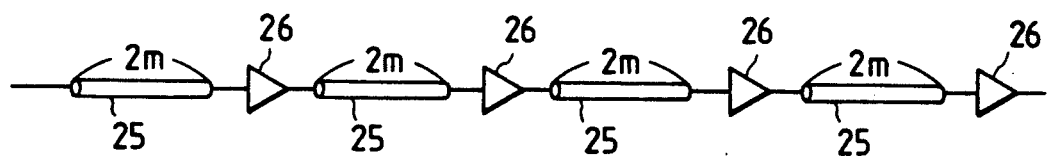
FIG. 5 is a schematic diagram showing a conventional practical composition of the delay circuit $15_r$.
Figure 4:
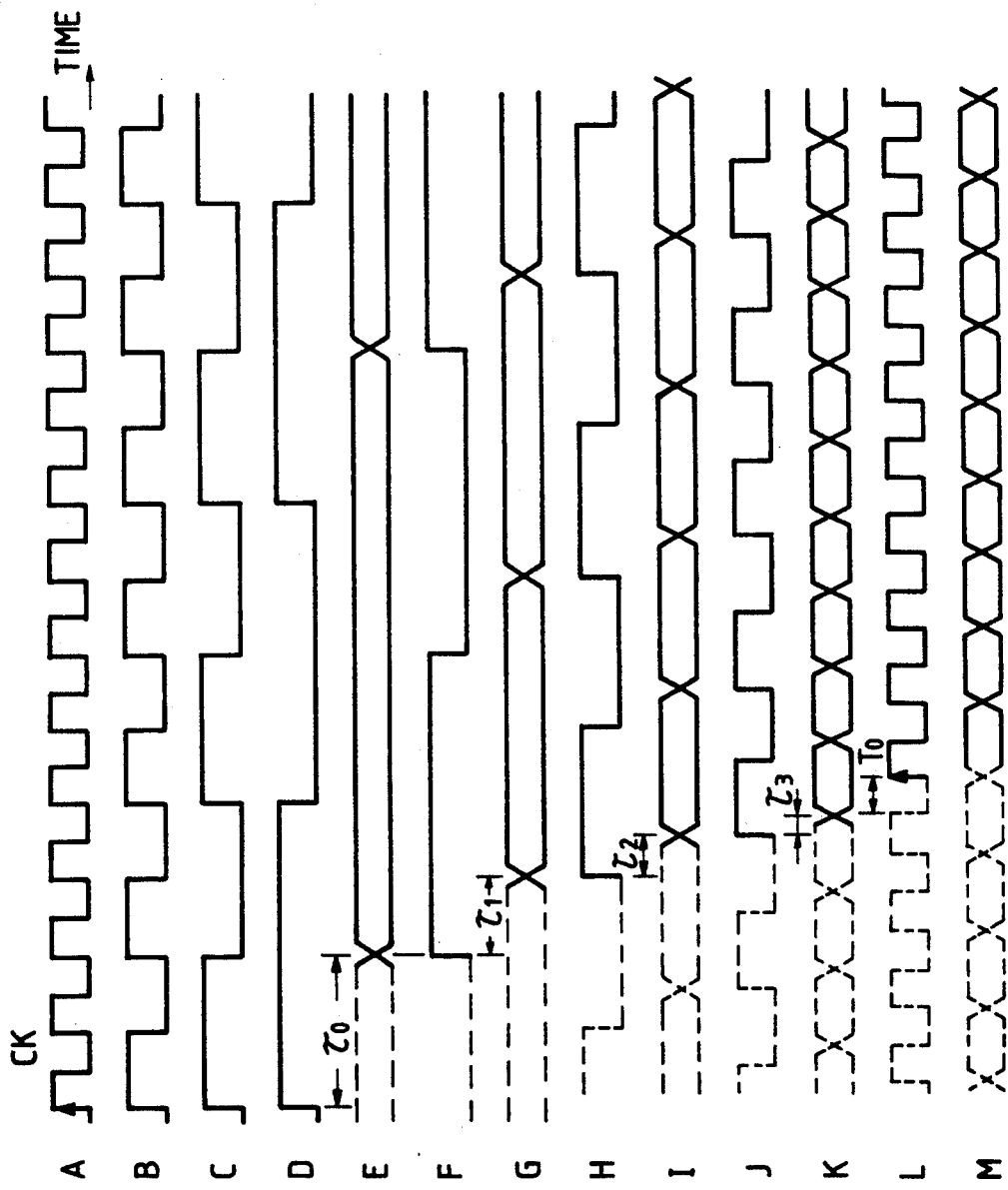
FIG. 4 is a time chart showing the waveform of each part for an example of the operation of the pattern generator shown in FIG. 1.
Figure 6:
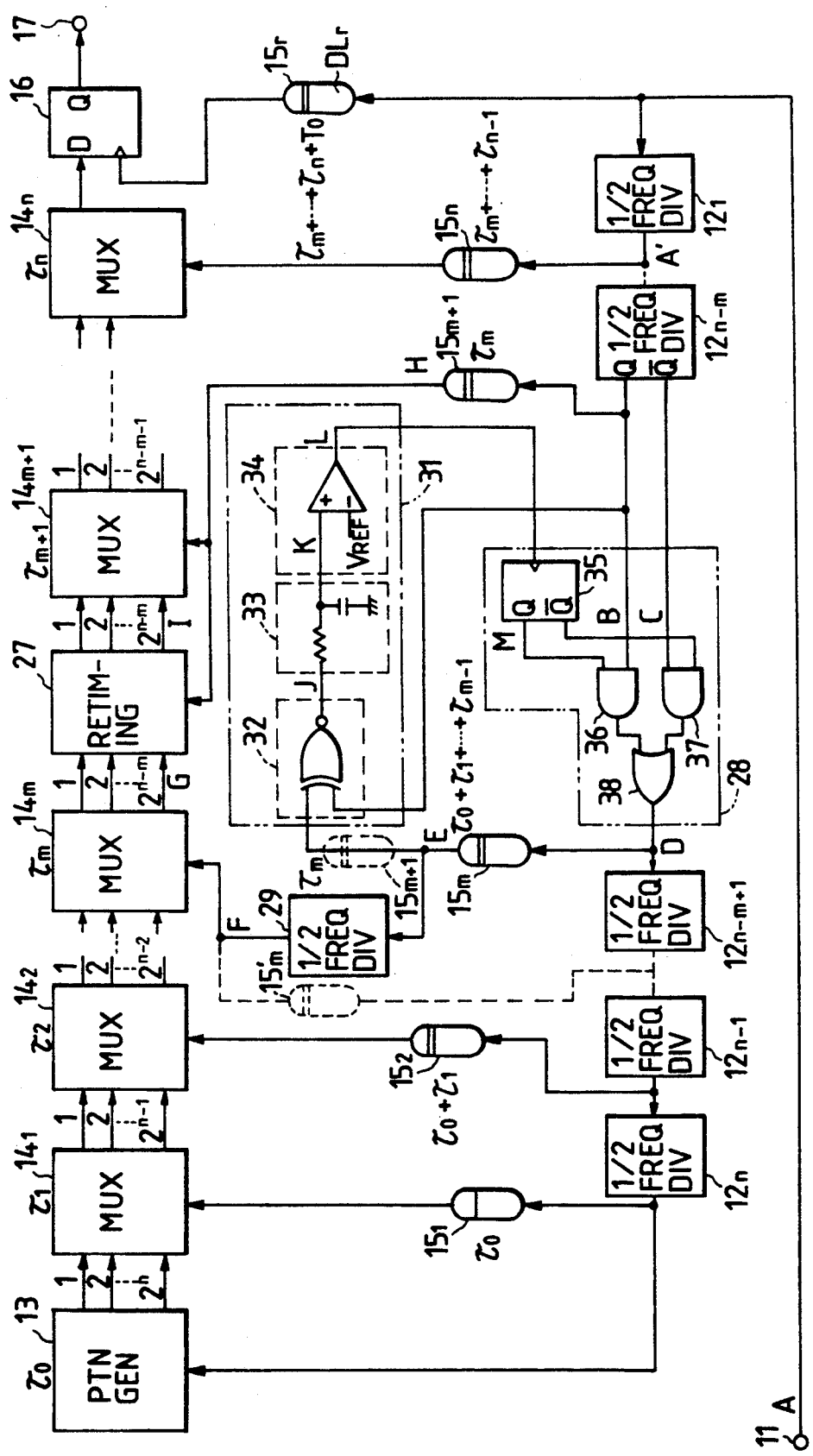
FIG. 6 is a block diagram showing an embodiment of the high-rate pattern generator according to the present invention.

FIG. 6 shows an embodiment of the present invention with the same numerals attached to the portions corresponding to those shown in FIG. 1. With the embodiment, an intermediate retiming circuit 27 is inserted in series between multiplexing circuits $14_m$ and $14_{m+1}$. The intermediate retiming circuit 27 effects retiming of the output from the multiplexing circuit $14_m$ with the same clock signal as the multiplexing control clock signal supplied to the multiplexing circuit $14_{m+1}$. The Q output of the frequency division circuit $12_{n-m}$ corresponding to the multiplexing circuit $14_{m+1}$ is supplied to the multiplexing circuit $14_{m+1}$ and the intermediate retiming circuit 27 via the delay circuit $15_{m+1}$. Q and $\overline{Q}$ outputs of the frequency division circuit $12_{n-m}$ are supplied to the phase switching circuit 28 from which either one is selectively output and supplied to the frequency division circuit $12_{n-m+1}$ while at the same time the output is supplied to the ½ frequency division circuit 29 via the delay circuit $14_m$. The output from the frequency division circuit 29 is supplied to the multiplexing circuit $14_m$ as a multiplexing control clock signal. The frequency of the output clock signal from the ½ frequency division circuit 29 is the same as the frequency of the output clock signal from the ½ frequency division circuit $12_{n-m+1}$. Therefore, in this embodiment the latter is supplied only to the ½ frequency division circuit $12_{n-m+2}$ (not illustrated) in the next stage.

When a conversion point (node) of the input pattern data of the intermediate retiming circuit 27 and the retiming clock signal of the intermediate retiming circuit 27 approach each other in a predetermined range, it is detected by the approach detection circuit 31. For this purpose, it is required to detect a phase difference between the timing clock signal whose phase is fixed at a value freely given to the intermediate timing circuit 27 and the node of the output pattern data from the multiplexing circuit $14_m$. However, it is impractical to directly detect the position of the data node relative to the retiming clock signal. Consequently, in this embodiment, there is provided a delay circuit $15_{m+1}$ between the Q output of the frequency division circuit $12_{n-m}$ and the intermediate timing circuit 27, giving the delay time equal to the delay $\tau_m$ in the multiplexing circuit $14_m$. The approach detection circuit 31 indirectly detects said phase difference on the basis of the Q output of the frequency division circuit 12n−m, which is $\tau_m$ earlier than the retiming clock signal of the intermediate retiming circuit 27, and the output of the delay circuit $15_m$, which is earlier than the node of the output pattern data from the multiplexing circuit $14_m$ by $\tau_m$, namely, the delay of the multiplexing circuit $14_m$ itself. The Q output of the frequency division circuit $12_{n-m}$ and the output of the delay circuit $15_m$ are supplied to the agreement detecting circuit 32 which issues an output of "1" as long as both inputs agree with each other. It issues "0" during disagreement. The output of the agreement detecting circuit 32 is smoothed by the averaging circuit 33. Smoothed output therefrom is compared with the reference value $V_{REF}$ in the comparator 34. Thus, comparison result of the comparator 34 is issued as a detection result of the approach detection circuit 31. Every time the output of the comparator 34 is inverted from a low level to a high level, the toggle type flipflop 35 of the switching circuit 28 is reversed. The Q and $\overline{Q}$ outputs of the toggle type flipflop 35 are supplied respectively to gates 36 and 37 in the phase switching circuit 28, while the $\overline{Q}$ and Q outputs of the frequency division circuit $12_{n-m}$ are supplied to the gates 36 and 37, respectively. The outputs from the gates 36 and 37 are issued via an OR circuit 38 as an output from the phase switching circuit 28.

Figure 7:
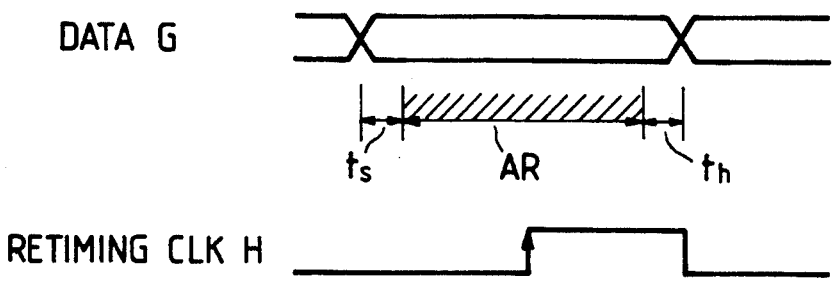
FIG. 7 is a diagram showing the allowable phase difference range between the input pattern data and the retiming clock of the intermediate retiming circuit 27.

The delay times in the delay circuits $15_1$–$15_m$ are determined in the same manner as a conventional method shown in FIG. 1, that is, they are $\tau_0, \tau_0 + \tau_1, —, \tau_0 + \tau_1 + — + \tau_{m-1}$. Whereas, the liming of the retiming clock signal for the intermediate retiming circuit 27 is irrespective of these delay times. Consequently, for the input data of the intermediate retiming circuit 27, it is not known what timing rising edge of the retiming clock signal occurs at. Therefore, as shown in FIG. 7, it is required to have a rising edge of the retiming clock within the phase difference allowable range AR between a setup time $t_s$ and a hold time $t_h$ required for the data. For this purpose, the approach detection circuit 31 and the phase switching circuit 28 are provided. In agreement with the delay time $\tau_m$ in the multiplexing circuit $14_m$, the delay time of the delay circuit $15_{m+1}$ is set at $\tau_m$.

Figure 8:
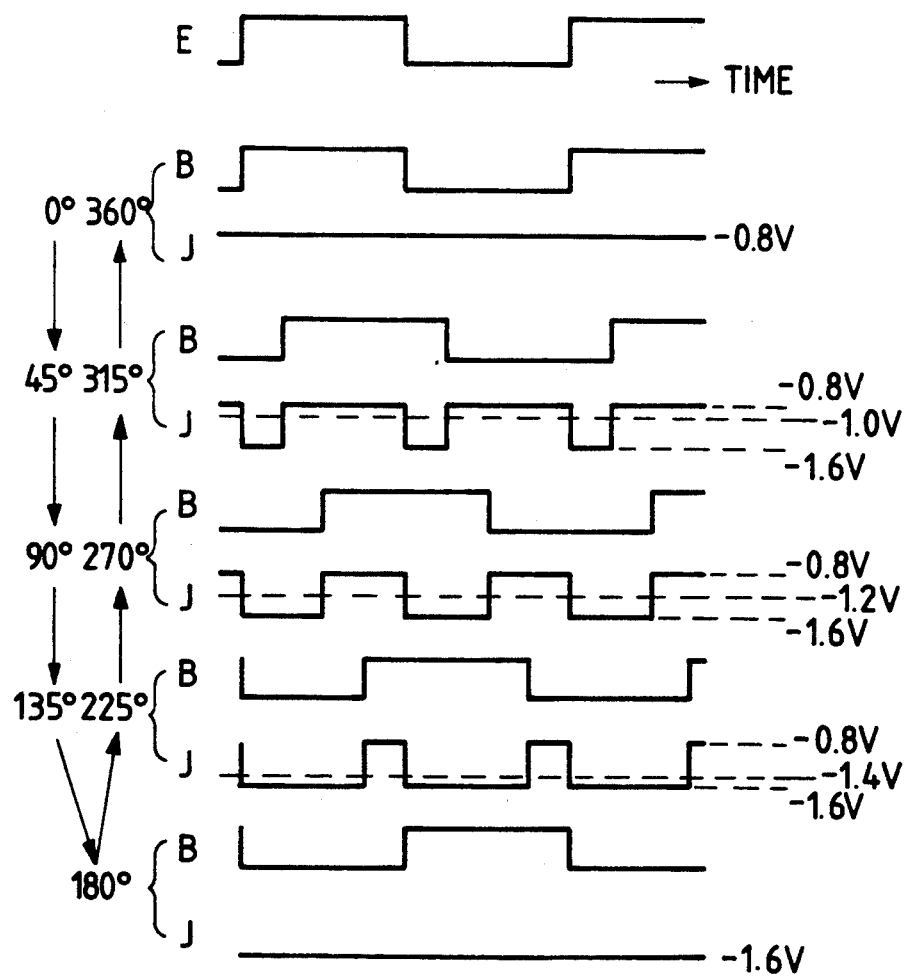
FIG. 8 is a time chart showing various phase difference states of both clocks of the agreement detecting circuit 32 and examples of the outputs.
Figure 9:
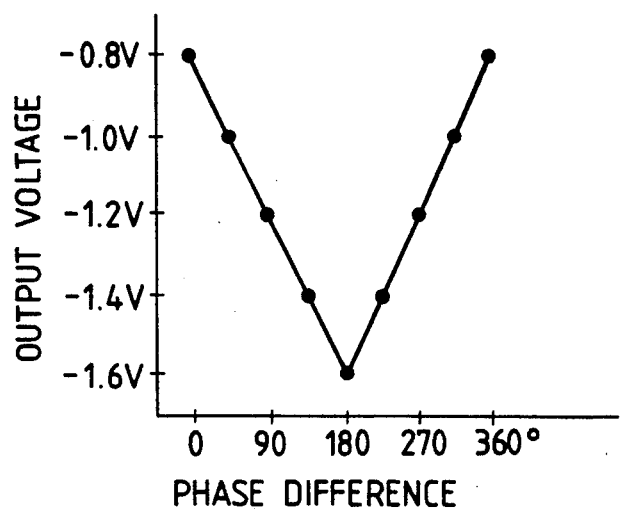
FIG. 9 is a graph showing an example of the relationship between the phase difference of both clocks in the agreement detecting circuit 32 and the output of an averaging circuit 33.

Since the multiplexing circuit $14_m$ issues a pattern data with a node delayed by $\tau_m$ from the edge of a given timing clock signal, the output of the delay circuit $15_m$ leads the input pattern data of the intermediate retiming circuit 27 by $\tau_m$. In addition, the Q output of the frequency division circuit $12_{n-m}$ leads the timing clock signal of the intermediate retiming circuit 27 by $\tau_m$. Consequently, detecting an approach between the output clock signal of the delay circuit $15_m$ and the Q output clock signal of the frequency division circuit $12_{n-m}$ means to detect approach between the input pattern data of the intermediate retiming circuit 27 and the retiming clock signal thereof as described above. Since the fixed delay time of the delay circuit $15_m$ causes a different phase delay for a different frequency of the input clock signal D, when the output clock E of the delay circuit $15_m$ is as shown in Row E of FIG. 8, the Q output clock signal B of the frequency division circuit $12_{n-m}$ of the same frequency can take various phases relative to the clock signal E as shown in the various states of Rows B in FIG. 8 when the frequency of the input clock signal A at the terminal 11 is changed. It is to be noted that in FIG. 8 various waveforms are illustrated after being normalized to the same cycle length as that of the clock signal E. Corresponding to various phase relationships between both clock signals, the output J of the agreement detecting circuit 32 takes the respective states as shown in Rows J of FIG. 8. Where the agreement detecting circuit 32 is ECL, high and low levels are −0.8 V and −1.6 V, respectively. When the phases of both clock signals coincide with each other, the high level −0.8 V is issued and remains as it is. When the phase difference between both clock signals is 180°, the low level −1.6 V is issued and remains as it is. When the phase difference is in between both levels, the proportion of the high level section to the low level section varies. The output level of the agreement detecting circuit 32 is averaged in the averaging circuit 33 and the levels shown by the dotted lines in Rows J of FIG. 8 are output according to phase differences between both clock signals. Output characteristics of the averaging circuit 33 in relation to phase differences of both clock signals become as shown in FIG. 9.

Therefore, by setting the reference voltage $V_{REF}$ of the comparator 34 at a value between −0.9 and −1.1 V for instance, when the phase difference between both clock signals falls outside the permissible phase difference range AR for the data node at the clock edge in FIG. 7 and the phase difference approaches 0° or 360°, the output of the averaging circuit 33 becomes larger than the reference voltage $V_{REF}$, thus inverting the output of the comparator 34 from the low level to the high level. As a result of this inversion, the toggle type flipflop 35 of the phase switching circuit 28 is reversed. Consequently, the $\overline{Q}$ output of the frequency division circuit $12_{n-m}$ is now supplied to the delay circuit $15_m$ via the gate 37, though heretofore the Q output of the frequency division circuit $12_{n-m}$ has been supplied to the delay circuit $15_m$ via the gate 36. Consequently, the multiplexing phase in the multiplexing circuit $14_m$ is shifted 90 degrees, thereby the difference between the output pattern data of the multiplexing circuit $14_m$ and the retiming clock signal H of the intermediate retiming circuit 27 now falls within the permissible phase difference range AR of FIG. 7. In addition, multiplexing phases of the multiplexing circuits in the stages before the intermediate retiming circuit 27 are also shifted more than before.

As described above, retiming is effected in the intermediate retiming circuit 27 by the Q output clock signal B of the frequency division circuit $12_{n-m}$ irrespective of the phase of the input pattern data. Therefore, the delay times of the delay circuits $15_{n+1}$ to $15_n$ to acquire multiplexing control clock signals for the multiplexing circuits $14_{n+1}$ to $14_n$ in the stages after the intermediate retiming circuit 27 may be set to $\tau_m, \tau_m+\tau_{m+1}, —, \tau_n+—+\tau_{n-1}$, respectively. These delay times of the delay circuits $15_{n+1}$ to $15_n$ are determined independently of the delay times of the pattern data subjected in the stages before the multiplexing circuit $14_m$. Consequently, the delay times become smaller than conventional values. In consequence, the delay time of the delay circuit $15_r$ producing a retiming clock signal for the retiming circuit 16 becomes $\tau_m + \cdots + \tau_n + \tau_0$, which is considerably smaller than conventional value $\tau_0 + \cdots + \tau_n + \tau_0$. In the description related to the foregoing FIG. 6, it is assumed that delay times in the respective frequency division circuits $12_1$-$12_n$, 29, retiming circuits 27, 16 and the phase switching circuit 28 are 0.

FIG. 10 shows the waveforms of respective parts indicated by A' through M in FIG. 6 when the output clock signal of the delay circuit $15_{m+1}$ approaches the node of the output data from the multiplexing circuit $14_m$ within an advanced phase of 45° or less with a reference voltage $V_{REF}$ of the comparator 34 set to $-1.0$ V ($\pm 45°$). More explicitly, the input clock signal shown in Row A' of FIG. 10 is entered into the frequency division circuit $12_{n-m}$. Then, the Q and $\overline{Q}$ outputs of the frequency division circuit $12_{n-m}$ become as shown in Rows B and C of FIG. 10, respectively. Furthermore, Row D indicates the output of the phase switching circuit 28; Row E the output of the delay circuit $15_m$; Row F the output of the frequency division circuit 29; Row G the output of the multiplexing circuit $14_m$; Row H the output of the delay circuit $15_{m+1}$; Row I the output of the intermediate retiming circuit 27; Row J the output of the agreement detecting circuit 32; Row K the output of the averaging circuit 33; Row L the output of the comparator 34; and Row M the output of the toggle type flipflop 35. In detail, when the output clock signal of the delay circuit $15_{m+1}$ (Row H of FIG. 10) approaches the node of the input pattern data (Row G of FIG. 10) in the intermediate retiming circuit 27 within a predetermined value (45°), the output of the averaging circuit 33 (Row K of FIG. 10) becomes larger than the reference voltage $-1.0$ V. Thereby, the output of the comparator 34 (Row L of FIG. 10) is inverted to the high level while making the Q output of the flipflop 35 (Row M of FIG. 10) turning to the low level. Thus, the output of the phase switching circuit 28 (Row D of FIG. 10) is switched to $\overline{Q}$ output (Row C of FIG. 10) and issued. Consequently, the inversion of the output of the frequency division circuit 29 (Row F of FIG. 10) is delayed by one fourth (90°) of the period. As a result, the difference between the node of the input pattern data of the intermediate retiming circuit 27 (Row G of FIG. 10) and the rising edge of the retiming clock signal (Row H of FIG. 10) increases by $\frac{1}{2}$ period of the retiming clock signal. Consequently, the section of the output of the agreement detecting circuit 32 (Row J of FIG. 10) where both clock signals input to the agreement detecting circuit 32 agree with each other becomes smaller while lowering the level of the output from the averaging circuit 33 (Row K of FIG. 10). In addition, as a result of the aforementioned phase switching of the clock signal, the phases of the multiplexing control clock signals for the multiplexing circuits $14_1$-$14_{m-1}$ in the stages before the multiplexing circuit $14_m$ are shifted correspondingly.

FIG. 11 shows the waveforms corresponding to those in FIG. 10, where the retiming clock signal H of the intermediate retiming circuit 27 approaches the node of the input pattern data from the multiplexing circuit $14_m$ within a lagging phase of 45° or less. In this case, too, the phase switching circuit 28 is switched to output the $\overline{Q}$ output of the frequency division circuit $12_{n-m}$. Thus, the node of the input pattern data of the intermediate retiming circuit 27 is departed from the rising edge of the retiming clock signal H.

Figure 12:
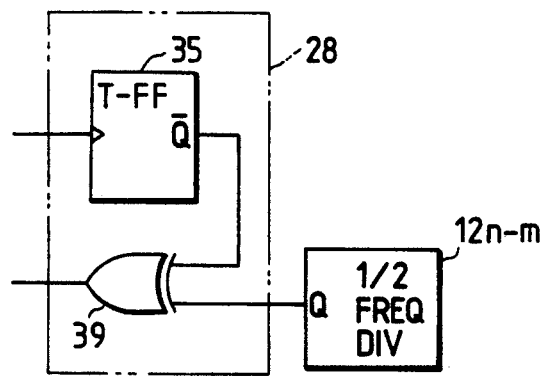
FIG. 12 shows a modified example of the phase switching circuit 28.
Figure 13:
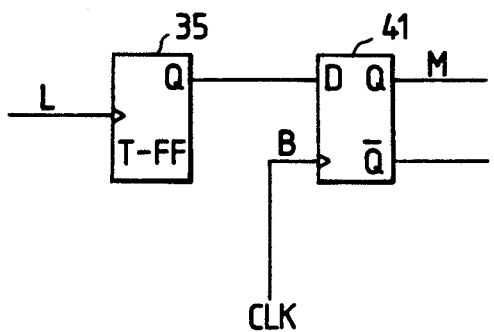
FIG. 13 shows an example for synchronizing the output of toggle type flipflop 35 with clock signal.

Referring to FIG. 6, it is also possible to move the delay circuit $15_{m+1}$ in between the delay circuit $15_m$ and the agreement detecting circuit 32 as shown in broken line. Also the frequency division circuit 29 may be omitted while supplying as shown by the dotted lines the output of the frequency division circuit $12_{n-m+1}$ to the multiplexing circuit $14_m$ via a delay circuit $15'_m$ with a delay time of $\tau_0 + \tau_1 + \cdots + \tau_{m-1}$. Also in this case, the delay circuit $15_{m+1}$ may be omitted (i.e., the delay may be set to zero) in the case where the delay quantity of the delay circuit $15_m$ is set to $\tau_0 + \tau_1 + \cdots + \tau_m$. Or, it is also possible to use the delay circuit $15_{m+1}$ with an arbitrary delay quantity and to apply the output clock signal H thereof, instead of the output clock signal B of the frequency division circuit $12_{n-m}$, to the agreement detecting circuit 32. The switching circuit 28 may also be constructed such as shown in FIG. 12 where the $\overline{Q}$ output of the toggle type flipflop 35 and the Q output of the frequency division circuit $12_{n-m}$ are supplied to the exclusive OR circuit 39, so that when the $\overline{Q}$ output of the flipflop 35 is in the high level, the Q output of the frequency division circuit $12_{n-m}$ is inverted and supplied to the delay circuit $15_m$. In addition, as shown in FIG. 13, it is possible that the Q output of the toggle type flipflop 35 is subjected to retiming by a clock signal B in the D type flipflop 41. In other words, in synchronism with the clock signal B, the $\overline{Q}$ output and Q output are supplied to the gates 36 and 37 of FIG. 6 or the $\overline{Q}$ output is supplied to the exclusive OR circuit 39 of FIG. 12, thereby stabilizing the operation. Furthermore, the intermediate retiming circuit 27 shown in FIG. 6 may also be inserted at several locations in the multi-stage connections of the multiplexing circuits.

Figure 14A:
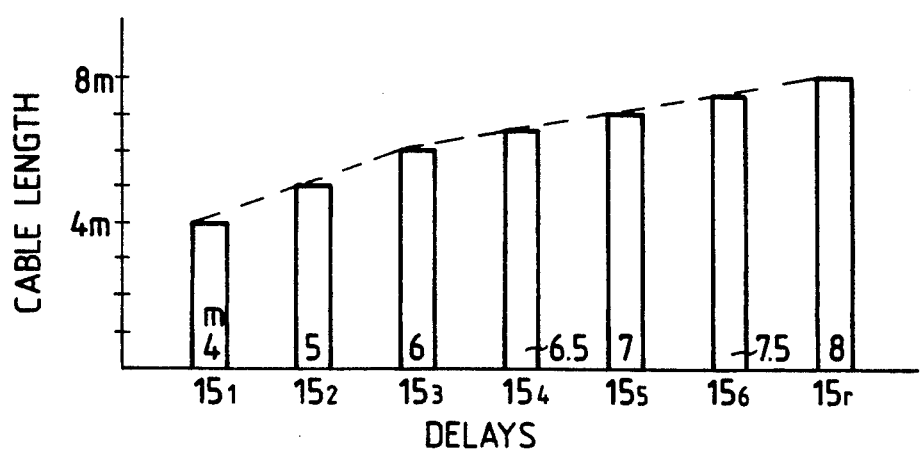
FIG. 14A is a graph showing a necessary length of the coaxial cable to realize each delay circuit in the case of n=6 with a conventional high-rate pattern generator.
Figure 14B:
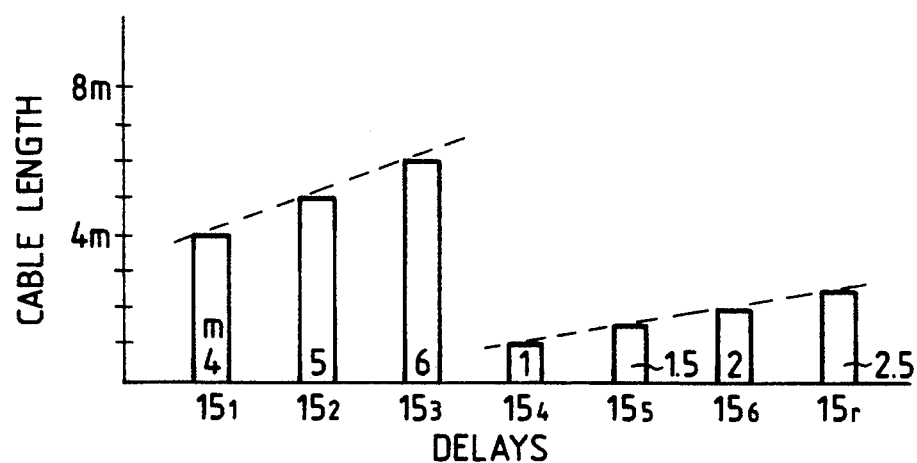
FIG. 14B is a graph showing the length of the coaxial cable to realize each delay circuit in the case of n=6 when the retiming circuit is provided between the third stage and the fourth stage of the multiplexing circuits.
Figure 14C:
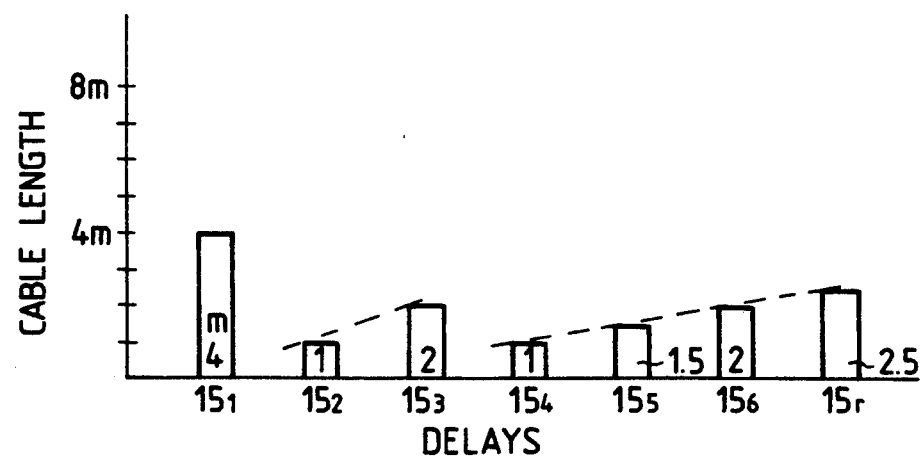
FIG. 14C is a graph showing the length of the coaxial cable to realize each delay circuit when another retiming circuit is inserted between the pattern generating circuit 13 and the multiplexing circuit $14_1$ in the first stage in the case of FIG. 14B.

FIG. 14A shows a design example of the length of a coaxial cable required for each of the delay circuits $51_1$-$15_6$ and $15_r$ in the conventional circuits shown in FIG. 1 where 6 stages (n=6) of the multiplexing circuits $14_1$-$14_n$ are provided. FIG. 14B shows a design example of the length of a coaxial cable required for each of the delay circuits $15_1$-$15_n$ and $15_r$ when n=6 is applied and the intermediate timing circuit 27 is provided between the multiplexing circuits $14_3$ and $14_4$ with the circuit according to the present invention shown in FIG. 6. FIG. 14C shows a design example of the length of a coaxial cable required for each of the delay circuits $15_1$-$15_6$ and $15_r$ where a further intermediate timing circuit is provided between the pattern generating circuit 13 and the multiplexing circuit $14_1$ in the arrangement of FIG. 14B. According to the conventional technology shown in FIG. 14A, the total length of a cable required for the delay circuits $15_1$-$15_6$ and $15_r$ becomes 44 m but, in the cases of FIG. 14B and 14C, it becomes 22 m and 14 m, respectively which clearly exhibits the effectiveness of the present invention.

With the embodiment of FIG. 6, the approach detection circuit 31 compares a data cycle to be subjected to retiming in the intermediate timing circuit 27 with the phase of the retiming clock and, when the retiming clock signal approaches the dead zone of the data cycle, the multiplexing control clock signal related to the data cycle in the multiplexing circuit of the stage immediately preceding the intermediate timing circuit 27 is shifted by 90°. However, since the setup time $t_s$ and hold time $t_h$ shown in FIG. 7 do not change in the same multiplexing circuit, the proportion of the permissible range AR in each cycle becomes smaller as the operation frequency of multiplexing becomes higher. Consequently, when clock phase is 180° inverted in the phase switching circuit 28, there arises a possibility that the clock edge exceeds the permissible range AR and enters the dead zone. In order to achieve a secure operation, therefore, it is mandatory to use an IC having short setup time $t_s$ and hold time $t_h$, and therefore short response time, as a component IC for each multiplexing circuit.

Figure 15:
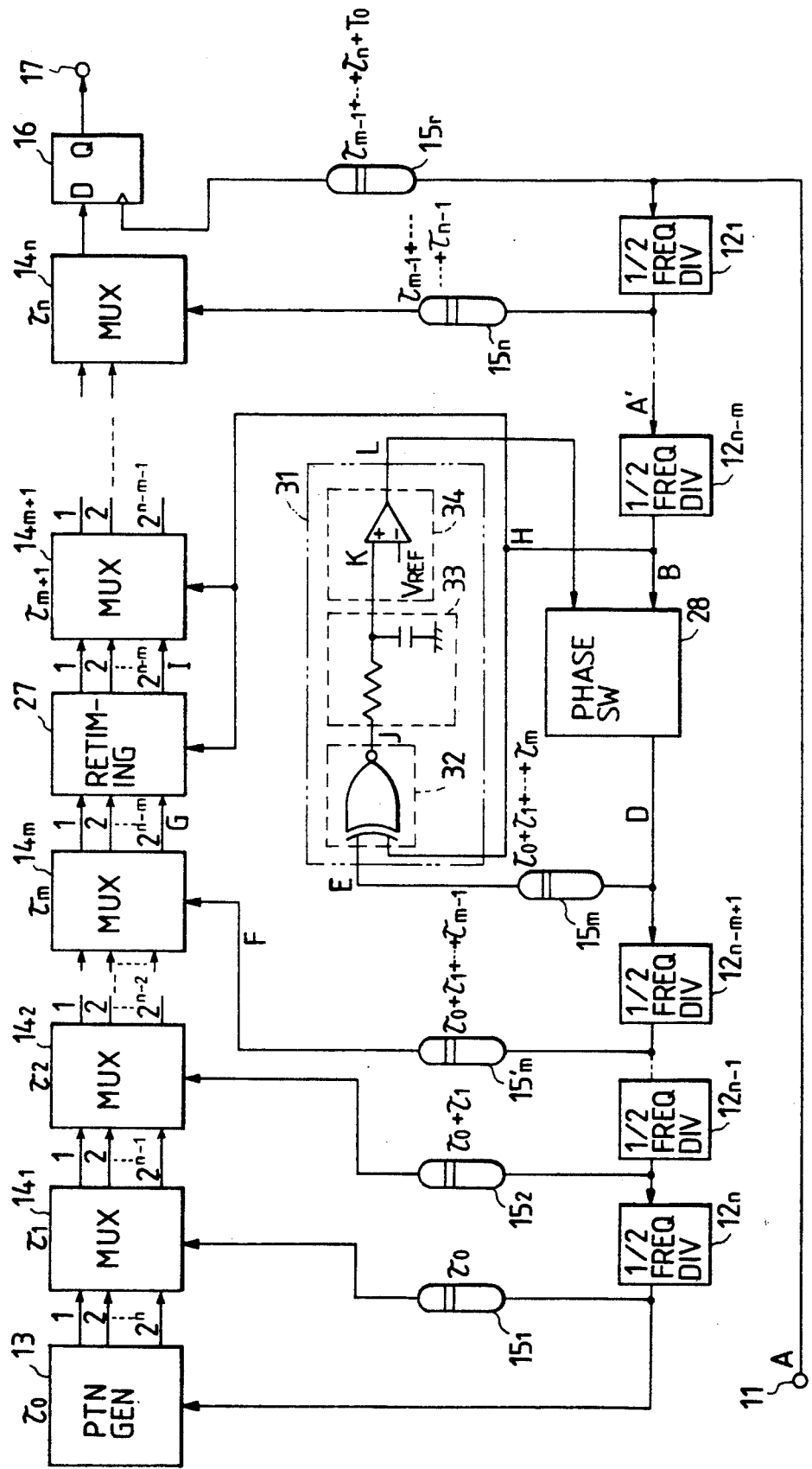
FIG. 15 is a block diagram showing another embodiment of the high-rate pattern generator of the present invention.

The embodiment of FIG. 15 is composed in such a manner that, when the approach detection circuit 31 detects approaching of the retiming clock signal in the retiming circuit 27 to the node of the input data within a predetermined range, the input clocks are shifted by a predetermined phase smaller than 180°, e.g., 90° repeatedly in one direction until said detection output disappears. In FIG. 15, the parts corresponding to those of FIG. 6 are numbered with the same numerals. The embodiment has been modified by the improvement described above from the modified embodiment of FIG. 6 where the frequency division circuit 27 is removed and the delay circuit $15'_m$ is provided as shown by the dotted lines. With this embodiment, the clock signal H to be applied to the retiming circuit 27 and the multiplexing circuit $14_{m+1}$ is the output clock signal B itself of the frequency division circuit $12_{n-m}$. Therefore, by setting the delay time of the delay circuit $15_m$ to $\tau_0 + \tau_1 + \cdots + \tau_m$, the edge of the output clock signal E of the delay circuit $15_m$ is made to coincide with the timing of the node for the input pattern data to the retiming circuit 27. In other words, the positional relationship between the edge of the retiming clock signal H and the node of the input pattern data G to the retiming circuit 27 is detected by the approach detection circuit 31 as a phase difference between the retiming clock signal H and the output clock signal E of the delay circuit $15_m$. With the embodiment of FIG. 15, the permissible range AR can be made smaller down to a minimum of ¼ period (90°). When the output of the agreement detecting circuit 32 in the approach detection circuit 31 is in ECL level, the reference voltage $V_{REF}$ to be supplied to the comparator 34 is set for instance at a range of $-1.1$ to $-1.3$ V. The construction of the embodiment is the same as that of FIG. 6 except for the phase switching circuit 28.

Figures 16, 18:
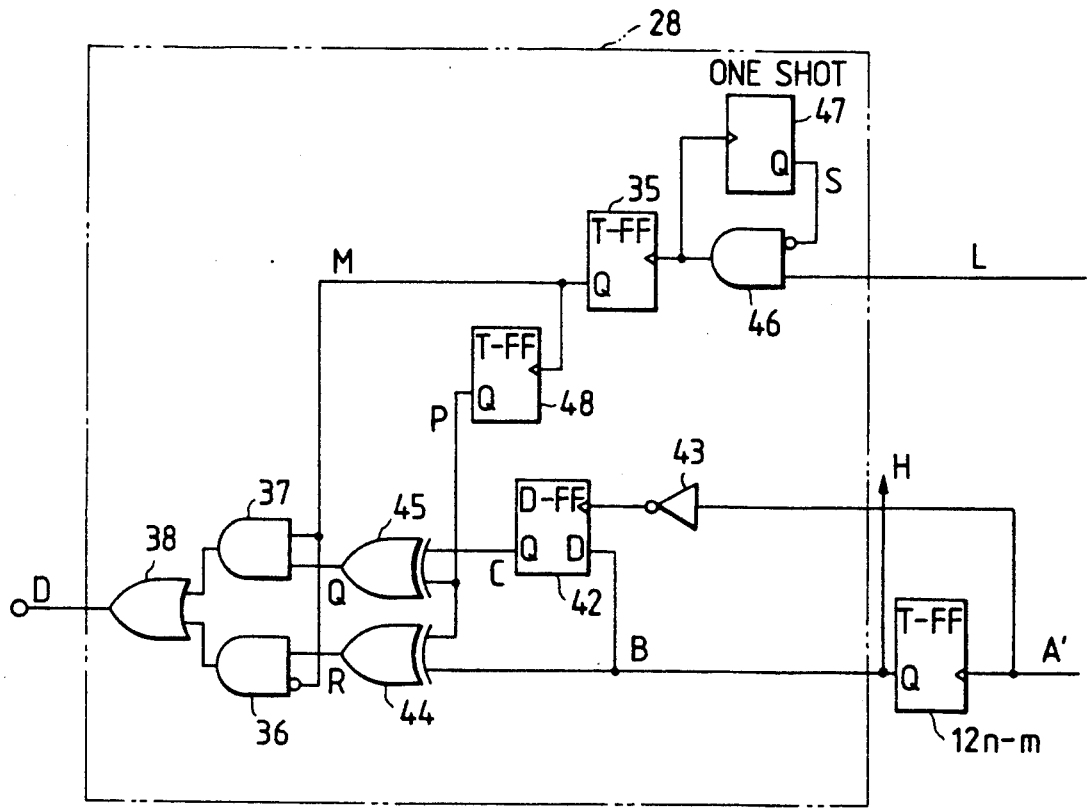
FIG. 16 is a circuit diagram showing an embodiment of the construction of the phase switching circuit 28 shown in FIG. 15.
FIG. 18 is a table showing the phase of the output clock D to be set by the signals M and P in the phase switching circuit 28.

The phase switching circuit 28 can be constructed for instance as shown in FIG. 16. The output clock signal B (Row B of FIG. 17) of the frequency division circuit $12_{n-m}$ is applied to the data terminal of the D type flipflop 42 in the phase switching circuit 28, and read in by the input clock A' (Row A' of FIG. 17) to the frequency division circuit $12_{n-m}$ inverted by the inverter 43. As a result, the clock signal C whose phase is 90° delayed from the clock signal B is output from the flipflop 42 as shown in Row C of FIG. 17. These clock signals B and C are applied to the input terminals in one side of the XOR circuits 44 and 45, respectively, which operate as inversion and non-inversion control circuits. The clock signal B is also applied as the signal clock H to the retiming circuit 27 and the multiplexing circuit $14_{m+1}$. The XOR circuits 44 and 45 let the clock signals B and C pass through as they are when the signal P applied to the other input terminals is "0". When the P is "1", the clock signals B and C are inverted and output. Therefore, the phase of the output R from the XOR circuit 44 becomes either the same as that of the clock signal B (phase lag of 0°) or reverse thereto (phase lag of 180°). Likewise, the phase of the output Q from the XOR circuit 45 is either 90° lagging or 270° lagging from that of the clock signal B. The gates 36, 37 and 38 select the clock signal R or Q according to whether the signal M is "0" or "1" and issue selected one as the clock signal D. FIG. 18 is a table to show the lagging phases of the clock signal D issued from the phase switching circuit 28, in relation to the clock signal B, according to the combination of the signals P and M.

The phase switching circuit 28 in the embodiment of FIG. 15 generates the signal M of a predetermined period and the signal P created by ½ frequency-dividing the signal M when a "1" detection output L is applied from the approach detection circuit 31 and as long as the "1" is continued to be effective. More explicitly, when the approach detection circuit 31 applies a detection output L to the AND gate 46 as shown in row L of FIG. 17, the oneshot multivibrator 47 is triggered by the rising of an output from the AND gate 46 to generate a pulse of a predetermined width Ts as shown in Row S of FIG. 17, which is applied to the inversion input terminal of the AND gate 46. The pulse width Ts is selected ¼ period longer than the period of the clock signal B. When the pulse S falls down as the time Ts elapses and if the detection output L is still "1" at that time, the oneshot multivibrator 47 is again triggered by an output of the AND gate 46. Therefore, as shown in Row S of FIG. 17, the pulse of the width Ts is repeatedly generated. Therefore, the AND gate 46 generates pulses of a narrow width upon the rising of the detection output L and the falling of each pulse S as long as the detection output L is held at "1". Every time such a narrow pulse is applied, the output of the T type flipflop 35 is inverted to produce the signal M shown in Row M of FIG. 17. The signal M is further applied to the T type flipflop 48 where it is ½ frequency-divided to produce the signal P shown in Row P of FIG. 17. According to the signal P, inversion or non-inversion in the XOR circuits 44 and 45 is controlled, while the selection of signals in the gates 36 and 37 is controlled by the signal M.

FIG. 17 is a time chart to show an operation example when the output clock signal E of the delay circuit $15_m$ leads the retiming clock signal H by 90° in the embodiment of FIG. 15. The waveforms of Rows A' through S are those of signals indicated by the same reference letters in FIGS. 15 and 16. The reference voltage $V_{REF}$ applied to the comparator 34 is set at $-1.3$ V (corresponding to the phase difference 112.5° referring to FIG. 9). Since the latest triggered states of the T flipflops 35 and 48 happen to be M=0 and P=1 as shown in Rows M and P until the output L of the approach detection circuit 31 becomes the high level at a certain timing, the phase of the clock signal D issued from the phase switching circuit 28 is 270° lagging from the phase of the input clock signal B. When the output L from the approach detection circuit 31 becomes the high level as shown in Row L, a narrow pulse is issued from the AND gate 46 to trigger the T flipflop 35, whereby the output M is inverted to "1". At the same time, the T flipflop 48 is triggered by the rising of the output M while making its output P "0". Such a state is maintained as long as the oneshot multivibrator 48 triggered by the output of the AND gate 46 is issuing the pulse S of width Ts as shown in Row S. Therefore, the clock signal D in a phase difference of 360° (0°) from the input clock signal B of the phase switching circuit 28 is issued in the meantime. Since the output L of the approach detection circuit 31 is still maintained at "1" when the first output pulse from the oneshot multivibrator 47 falls as shown in Row L, the oneshot multivibrator 47 is again triggered to generate the second pulse S of width Ts. As M=0 and P=0 hold valid in this second section, the phase switching circuit 28 issues the clock signal D whose phase lags 90° from that the input clock signal B. In the same manner as described above, in the section of the third output pulse S of the oneshot multivibrator 47, the phase switching circuit 28 generates the clock signal D whose phase lags 180° from that of the input clock signal B. Upon falling of this third pulse S, the output L of the approach detection circuit 31 is already "0". Therefore, the T flipflops 35 and 48 are not triggered while holding their output logical states prevailed heretofore. Consequently, the clocks D to be subsequently issued from the phase switching circuit 28 maintain a lagging of 180° in relation to the input clock signal B.

With the embodiment of FIG. 15 as described above, when the edge of the retiming clock H approaches the node of the input pattern data G of the retiming circuit 27, the phase switching circuit 28 repeats to shift the input clock signal B by for instance 90° which is smaller than 180° conventionally used to shift it at one time, until the output L of the approach detection circuit 31 becomes "0". Although FIG. 17 described the operation in the case that the output clock signal E of the delay circuit $15_m$ was leading in the phase in relation to the retiming clock signal H from the phase switching circuit 28, it is also possible to automatically shift the edge of the retiming clock signal H within the permissible range AR even when it is lagging, by shifting the output clocks D by 90° each. Thus, with the embodiment of FIG. 15, the phase of the output clock signal D can be shifted by 90° each. Therefore, it is possible to shift the rising of the retiming clock H within the permissible range AR by repeating to shift the clock signal D by 90° each no matter whether the rising edge of the retiming clock signal H is within either the setup time $t_s$ or hold time $t_h$, as long as the width of the permissible range AR in FIG. 7 is at least larger than 90° (¼ period). That is, with the embodiment of FIG. 15, even when the setup time $t_s$ and hold time $t_h$ of the multiplexing circuit $14_m$ are so long as nearly 135° each (or the sum of $t_s$ and $t_h$ is so long as close to 270°), the retiming circuit 27 is operable. To the contrary, with the embodiment of FIG. 6, the phase switching circuit 28 is operated so that the output clock signal D is shifted by 180°, resulting in a permissible range larger than 180°. Therefore, it is required to have the sum of the setup time $t_s$ and hold time $t_h$ shorter than 180°. Accordingly, it is mandatory to employ such a multiplexing circuit as operated at a higher rate.

According to the present invention as described above, the intermediate retiming circuit is inserted in series in the input of at least one of multiplexing circuits connected in cascade, and the output clock signal from the corresponding one of the frequency division circuits is supplied without substantial delay to said intermediate retiming circuit as a retiming clock signal. Thereby, in the stages after the intermediate retiming circuit, it is satisfactory to delay clock signals to be supplied to the multiplexing circuits by delay times caused by these multiplexing circuits. Consequently, such delay times become considerably smaller than conventional values. Likewise, the delay time for a retiming clock signal to be supplied to the retiming circuit 16 in the final stage can also be made smaller than conventional values. Hence, it is possible to construct a high-frequency clock delay circuit $15_r$ using for instance a 2 m coaxial cable and an amplifier. Thus, the advantages provided by the present invention include smaller waveform deterioration, correct retiming and low cost of the equipment.

What is claimed is:

1. A high-rate pulse pattern generator comprising:

frequency division circuits connected in cascade in the first stage through the n-th stage, for receiving and sequentially ½-frequency-dividing entered clock signals, where n is an integer of 2 or larger;

a pattern generator for generating N pieces of pattern data parallel to each other in synchronism with an output clock signal from said frequency division circuit in the n-th stage, where N is an integer of 2 or larger but not larger than $2^n$;

multiplexing circuits connected in cascade in the first stage through the n-th stage, for receiving said pattern data in parallel to each other from said pattern generating circuit, each said multiplexing circuit multiplexing every two input pattern data into one under control of a multiplexing control clock signal and issuing the multiplexed pattern data;

(n−1) first control clock supply circuit for providing said multiplexing control clock signals to said multiplexing circuits in the n-th to first stages except the m-th stage according to frequency division output clock signals of the frequency division circuits in the first to n-th stages except the m-th stage, where m is one of integers from 0 to (n−1);

a second control clock supply circuit for providing said multiplexing control clock to the multiplexing circuit in said m-th stage according to either one of an input clock signal to and an output clock signal from said frequency division circuit in the (n−m+1)th stage;

a retiming circuit inserted in series to the input of said multiplexing circuit in the (m+1)th stage for receiving, as a retiming clock signal, said multiplexing control clock signal to be supplied to the multiplexing circuit in the (m+1)th stage from said frequency division circuit in the (n−m)th stage through corresponding one of said first control clock supply circuits, and thereby retiming the input pattern data and applying the result to said multiplexing circuit in the (m+1)th stage;

an approach detection means for detecting a relative phase difference between a node of the pattern data entered into said retiming circuit and an edge of said retiming clock and, when said phase difference falls within a predetermined range, issuing an approach detection signal; and a phase switching means inserted in series to the output of said frequency division circuit in the (n−m)th stage for responding to said approach detection signal from said approach detection means, shifting an output clock signal from the frequency division circuit in said (n−m)th stage by a predetermined phase quantity and supplying the result to the frequency division circuit of the next stage.

2. The high-rate pulse pattern generator of claim 1, wherein said second control clock supply circuit includes a first delay circuit connected to the output side of the frequency division circuit in the (n−m+1)th stage for delaying the output clock signal therefrom by a predetermined quantity and applying the result to the multiplexing circuit in the m-th stage as said multiplexing control clock.

3. The high-rate pulse pattern generator of claim 1, wherein said second control clock supply circuit includes a delay circuit connected to the input of the frequency division circuit in the (n−m+1)th stage for delaying the input clock signal therefrom by a predetermined quantity, and a ½ frequency division circuit for ½-frequency-dividing said delayed clock and applying the result to the multiplexing circuit in the m-th stage as said multiplexing control clock signal.

4. The high-rate pulse pattern generator of claim 2, wherein said phase switching means comprises a means that shifts the phase of the output clock signal from the frequency division circuit in said (n−m)th stage in response to said approach detection signal, by 180° and issues the result.

5. The high-rate pulse pattern generator of claim 2, wherein said pulse switching means comprises a means which increases the phase of the output clock signal from the frequency division circuit in the (n−m)th stage in every predetermined interval by a predetermined quantity smaller than 180° in response to said approach detection signal.

6. The high-rate pulse pattern generator of claim 5, wherein said phase switching means includes a means which generates multi-phase clock signals of the phases of 0°, 90°, 180° and 270° from the output clock signal from the frequency division circuit in said (n−m)th stage, in the same frequency as that thereof, and a means which sequentially and cyclically selects said multiphase clock signals in said predetermined intervals as long as said approach detection signal is given.

7. The high-rate pulse pattern generator of claim 3, wherein said phase switching means comprises a means that shifts the phase of the output clock signal from the frequency division circuit in said (n−m)th stage in response to said approach detection signal, by 180° and issues the result.

8. The high-rate pulse pattern generator of claim 3, wherein said pulse switching means comprises a means which increases the phase of the output clock signal from the frequency division circuit in the (n−m)th stage in every predetermined interval by a predetermined quantity smaller than 180° in response to said approach detection signal.

9. A high-rate pulse pattern generator wherein an input clock signal is sequentially frequency-divided by a plurality of frequency division circuits connected in cascade, a pattern generating circuit is actuated by an output clock signal at the end of said cascade connection of the frequency division circuits, a plurality of pattern data are produced in parallel to each other from said pattern generating circuit, said pattern data are sequentially multiplexed in multiple stages of a plurality of multiplexing circuits using the outputs from said frequency division circuits, and final multiplexed output pattern data are subjected to retiming, comprising:

an intermediate retiming circuit connected at a place intermediate in a multiple-stage connection of said multiplexing circuits, for retiming the output pattern data of the preceding multiplexing circuit by a clock signal substantially not delayed from the output clock of said frequency division circuit in the corresponding stage;

a detection means for detecting, when a retiming clock signal of said intermediate retiming circuit approaches a node of the input pattern data in said intermediate retiming circuit within a predetermined range, the approach and producing a detection output; and a means for shifting the phase of the clock signal by a constant amount to be supplied to the frequency division circuit that generates a clock signal for multiplexing control, in relation to the multiplexing circuit immediately preceding said intermediate retiming circuit, by said detection output of said detection means.

10. The high-rate pulse pattern generator of claim 9, wherein said constant amount of the phase to be shifted is 180°.

11. The high-rate pulse pattern generator of claim 9, wherein said shifting means incrementally shifts the phase of clock signal by said constant amount at every predetermined interval as long as said detection output lasts.

12. The high-rate pulse pattern generator of claim 11, wherein said incremental shifts of phase starts any one of 0°, 90°, 180° and 270° and cyclically shifts in this order.

* * * * *

UNITED STATES PATENT AND TRADEMARK OFFICE
CERTIFICATE OF CORRECTION

PATENT NO. : 5,150,390
DATED : September 22, 1992
INVENTOR(S) : Mishio Hayashi et al.

It is certified that error appears in the above-identified patent and that said Letters Patent is hereby corrected as shown below:

Col. 2, line 21, "$\gamma_1$" should be --$\gamma_0$--.

Col. 5, line 45, "liming" should be --timing--.

Col. 6, line 46, "$12_n\text{-}m$" should be --$12_{n\text{-}m}$--.

Col. 8, line 31, "$\bar{Q}$ output and Q" should be --Q output and $\bar{Q}$--.

Signed and Sealed this

Twenty-eighth Day of September, 1993

Attest:

BRUCE LEHMAN

Attesting Officer

Commissioner of Patents and Trademarks